United States Patent [19]

Janin et al.

[11] Patent Number: 4,734,867

[45] Date of Patent: Mar. 29, 1988

[54] SYSTEM FOR DISPLAYING EVOLUTION OF ONE PHYSICAL PARAMETER COMPARED WITH DEVELOPMENT OF ANOTHER PHYSICAL PARAMETER

[75] Inventors: Paul Janin, Taverny; Jean-Louis Queri, Marseille, both of France

[73] Assignee: Electricite de France, France

[21] Appl. No.: 681,224

[22] Filed: Dec. 13, 1984

[30] Foreign Application Priority Data

Dec. 14, 1983 [FR] France ............................. 83 20038

[51] Int. Cl.[4] .............................................. G06F 15/62
[52] U.S. Cl. ................................... 364/518; 340/799
[58] Field of Search ............... 364/518, 521, 188, 550, 364/551, 178, 179, 481; 324/121 R; 340/722, 747, 799; 376/245, 259

[56] References Cited

U.S. PATENT DOCUMENTS 4,303,973 12/1981 Williamson, Jr. et al. ...... 340/722 X
4,325,223 4/1982 Cantley ............................ 364/551 X
4,482,861 11/1984 Jalovec et al. ............. 324/121 R X
4,504,920 3/1985 Mickowski ..................... 364/551 X

FOREIGN PATENT DOCUMENTS 2013056 10/1971 Fed. Rep. of Germany .
2515358 4/1983 France .
59-68696 4/1984 Japan ................................. 376/245
2052077 1/1981 United Kingdom .

OTHER PUBLICATIONS

Der Lechnergesteurte Oszillograf, by Lipinski et al., Elektronik, vol. 22, No. 8, (Aug. 1973).
Possibilites de l'oscilloscope 'calculateur', by Pacheu, Toute l'electronique, No. 456, Aug./Sep. 1980.
Electronics, vol. 49, No. 8, Rose et al., "Microprocessor Routes Data Inside Programable Scope", p. 148-149.

Primary Examiner—Arthur T. Grimley
Assistant Examiner—J. Pendegrass
Attorney, Agent, or Firm—M. N. Meller

[57] ABSTRACT

The invention relates to a process and a system for the display of time-variable quantities.

The system comprises a computer, a memory for recording the values of the quantities, a clock, acquisition means for the values of the quantities, connected to the computer, as well as display means connected to the computer. The system also comprises means for simultaneously recording in the computer memory and at the same acquisition frequency, the development of the values of one of these quantities compared with the development of the values of the other of said quantities, or the development of the values of one of these quantities compared with the development of the values of the other of these quantities as a function of time, the computer controlling the display means in order to obtain the image of the graph or graphs representing said development or developments.

Application to the display of the development of values of physical quantities.

4 Claims, 1 Drawing Figure

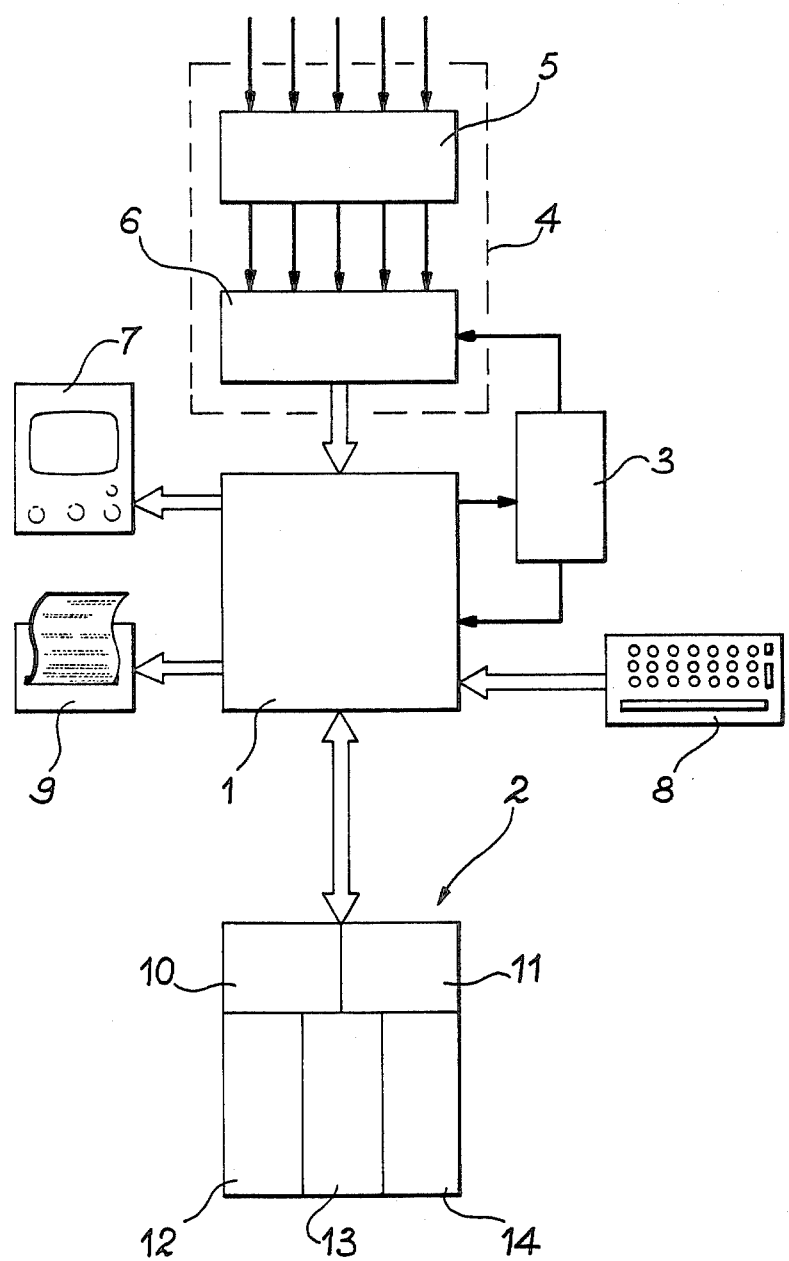

SYSTEM FOR DISPLAYING EVOLUTION OF ONE PHYSICAL PARAMETER COMPARED WITH DEVELOPMENT OF ANOTHER PHYSICAL PARAMETER

BACKGROUND OF THE INVENTION

The present invention relates to a method for the display of time-variable physical parameters as well as to an apparatus making it possible to carry out this method.

It more particularly applies to the display of the graph or graphs representing the development of relative values of physical parameters. The invention also applies to the display of the graph representing the relative development of physical parameters with respect to time. In both the aforementioned applications, the values of physical parameters are acquired as a function of time. This method apparatus can more particularly be used in checking the operation of any installation in which the physical parameters are measured periodically by choosing predetermined sampling frequencies. These measurements make it possible to follow the development of the operation of this installation over a period of time and optionally to intervene in the case of an incident in said operation. For example, this is the case in nuclear reactors, where it is necessary to detect any axial unbalance of the reactor power, so that it can be effectively cured. This unbalance is detected by following, during operation, the development of the reactor power value as a function of the high and low flux values generated by the fuel. Constantly following this development makes it possible to control the reactor in such a way that it operates at its maximum power. It also makes it possible to carry out rapid power variations, such as the daily load variation. This control consists of modifying the level of the control rods in the reactor vessel or the boric acid concentration.

At present, no system or process for the display of variable parameters in time are known which make it possible to display the development of the values of one of these parameters compared with the other and optionally the development of the values of one of these parameters compared with the other as a function of time, the values of these parameters being supplied initially and separately, as a function of time. In addition, no process or system are known making it possible to display these developments in accordance with variable scales and in accordance with variable periodic sampling of these parameters which develop with respect to one another and optionally with respect to time.

The known devices include plotting tables or multicurve display systems, which only make it possible to simultaneously represent the variations of the values of two physical parameters relative to time. These processes and systems do not make it possible to also represent variations of one of these parameters relative to the other and optionally relative to time. In addition, these known devices only make it possible with very considerable difficulty to vary the sampling or acquisition frequency of these parameters, to vary the display scale of the graph representing their relative development and to vary the selection frequency of the relative values of these parameters, in order to display the graph representing this development over a period of varying length. These systems do not make it possible to accurately determine the paths followed during the variations of parameters producing loops.

SUMMARY OF THE INVENTION

The object of the invention is to obviate these disadvantages and more particulary to permit the display of the relative development of values of physical parameters, the sampling or acquisition frequency of these parameters, as well as the selection frequency of the relative values of these parameters being regulatable, and the display scale of the graph representing the development of these parameters being selectable in a predetermined manner.

The invention also relates to an apparatus for the display of time-variable physical parameters, comprising a computer, a memory connected to the computer for recording the values of these parameters, a regulatable frequency clock connected to means for the acquisition of the values of these parameters in order to fix at least one sampling or acquisition frequency for the values of said parameters, the outputs of the acquisition means being connected to the computer, as well as display means connected to the computer, wherein the invention also comprises means for simultaneously recording in the computer memory, and at the same frequency, the development of the values of one of these parameters compared with the development of the values of the other of these parameters, or the development of the values of one of these parameters compared with the development of the values of the other of these parameters as a function of time, the computer controlling the display means in order to obtain the image of the graph or graphs representing the development or developments.

According to another feature, the apparatus also comprises means for applying multiplication factors to each of the values recorded during the development or developments in order to obtain a predetermined display scale of the graph or graphs, related to the choice of each of the factors.

According to another feature, the regulatable clock is also connected to the computer in order to display the graph or graphs, on the basis of values recorded during the development or developments, these values being selected in the memory with a selection frequency equal to the predetermined sampling frequency, or on the basis of only some of the values recorded during the development or developments, these values being selected in the memory with a selection frequency which is a multiple of the sampling frequency.

According to another feature, the means for recording the values of the parameters during the development or developments comprise stored correspondence tables.

According to another feature, the multiplication means comprise tables for multiplication by the stored factors.

DESCRIPTION OF THE DRAWING AND PREFERRED EMBODIMENTS

The features and advantages of the invention can be better understood from the following description with respect to the attached drawing, which diagrammatically shows a recording and display system according to the invention.

The system according to the invention comprises a computer 1, a memory 2 connected to the computer, a variable frequency clock 3 connected to the computer, as well as means 4 for the acquisition of time-variable physical parameters. The acquisition means 4 can e.g. comprise an analog-digital converter 5 receiving variable physical parameters and a multiplexer 6, whose outputs are connected to computer 1 and whose inputs are connected to the outputs of converter 5. The regulatable clock 3 makes it possible to fix at least one sampling or acquisition frequency for the values of the parameters supplied to the computer 1 by multiplexer 6. The predetermined sampling frequency corresponds to the recording frequency of the values of the time-variable physical parameters in memory 2. The system also comprises e.g. cathode-type display means 7. This system can also comprise a data input keyboard 8, in order more particularly to make it possible to control the frequency regulation of clock 3. A printer 9 can also be connected to computer 1.

The system also comprises means for simultaneously recording in the computer memory, and at the same frequency as the sampling frequency, the development of the values of one of these parameters compared with the values of the other parameter, or the development of the values of one of these parameters compared with the values of the other parameter and relative to time. The computer then controls the display means in order to obtain the graph representing each of these developments, as will be shown in greater detail hereinafter.

Thus, if it is e.g. assumed that two parameters x and y, whose values vary as a function of time (t) ($x = f(t)$ and $y = g(t)$) are initially acquired, the means for recording the development of the relative values of these parameters are constituted by stored tables 12, 13. For the predetermined sampling or acquisition frequency of these parameters, these tables make it possible to obtain either the development of the values of x compared with the values of y, which can be designated $x = h(y)$ (relative development of the values of these, parameters, or the development of the values of x compared with the values of y with respect to time t, which development can be designated $x = e(y, t)$. The values $x = f(t)$ and $y = g(t)$ supplied to computer 1 in digital form by acquisition means 4 can be respectively stored in zones 10 and 11 of random access memory 2. Tables 12, 13 in the memory then make it possible to establish the relations $x = h(y)$ and/or $x = e(y, t)$. The sampling or acquisition frequency of the values of the physical parameters supplied by acquisition means 4 can be modified at any time using the data input keyboard 8.

The system also comprises means for simultaneously applying multiplication factors to each of the recorded values of the parameters, which multiplication factors make it possible to obtain, in relation to the choice of each of these factors, a predetermined display scale for the graphs representing the developments of the relative values of the acquired parameters. These means comprise a table 14 in memory 2 of computer 1. This table enables the selected sampling frequency to apply a multiplication factor to the values of x and/or to the values of y. Thus, this multiplication factor makes it possible to increase or decrease the extent or scope of the graph displayed on the screen of display means 7. Thus, whereas in the case of conventional known display systems, it is simply possible to display the development with respect to time of the values of x and y separately, the system according to the invention makes it possible to represent the development of the values of x relative to the values of y and optionally the development of the values of x compared with the values of y with respect to time t. Keyboard 8 also makes it possible to modify the multiplication factor applied to values of acquired parameters. This multiplication is obviously carried out at the same frequency as the predetermined sampling frequency.

Clock 3 is also connected to computer 1 in order to display the graph of $x = h(y)$ and/or $x = e(y, t)$ at a predetermined selection frequency of the relative values of these parameters supplied by the aforementioned tables. This selection frequency can be equal to the sampling frequency, or it can be a multiple of the latter. When the selection frequency is equal to the sampling frequency, the graph obtained on the display screen represents the instantaneous development of the relative values of the parameters. When the selection frequency is a multiple of the sampling frequency, the graph obtained on the display screen makes it possible to follow the time development of the relative values of the parameters. Thus, for a process with a long duration (e.g. several hours), it is possible to select in the tables of the memory only the relative values of the parameters corresponding to an acquisition which will e.g. be performed every 5 to 10 minutes, or in accordance with any other predetermined period.

The method and apparatus according to the invention can e.g. be applied to the control of a nuclear reactor at its maximum power or in the case of a load variation. In this case, the power of the reactor is measured as a function of time and the corresponding data are acquired in the computer memory with a predetermined sampling frequency. In the same way, the data relating to the axial unbalance $\Delta\phi$ of the power are acquired as a function of time with the same sampling frequency. The method and apparatus according to the invention then make it possible to display the graph representing the power variation of the reactor, as a function of its axial power unbalance. A detailed description will not be provided here on the known methods for measuring the power and axial unbalance of a reactor. The graph obtained makes it possible to follow instantaneously or over a period of time, the power of the reactor as a function of the axial unbalance and thus to rapidly take action on the means controlling the power. This control makes it possible to maintain the power-unbalance pair within an operating range, whose limits are calculated in real time by the computer. With the known processes and systems, urgent intervention is not possible because, on the basis of the graphs representing the power as a function of time and the graph representing the axial power unbalance as a function of time, the operator must consult nomograms enabling him to calculate the power at a given time as a function of the axial unbalance. As a result of this long operation, it is not possible to act rapidly on the reactor power control means. In addition, the operator cannot display the graph representing this development over a period of time and consequently does not have a historical account of the operation. These disadvantages are obviated by the method and apparatus of the present invention.

What is claimed is:

1. A system for the display of time-variable physical parameters, comprising a computer, a memory connected to said computer for recording acquired values of these parameters, a regulatable frequency clock connected to means for the acquisition of the values of these parameters in order to fix at least one predetermined sampling or acquisition frequency for the values of said parameters, outputs of said acquisition means being connected to the computer, as well as display means connected to the computer, wherein said system also comprises means for simultaneously recording in the computer memory and at the same frequency and in the time acquired order, the development of the acquired values of one of these parameters compared with the development of the acquired values of the other of said parameters, the computer controlling the display means in order to obtain the image of the graph or graphs representing said development, the computer being capable of selecting the recorded values of said parameters in the memory at a predetermined selection frequency different than said predetermined sampling frequency.

2. A system according to claim 1, wherein it also comprises means for applying multiplication factors to each of the values recorded during said development or developments, in order to obtain a predetermined display scale of the said graph or graphs, related to the choice of each of the factors.

3. A system according to claim 1, wherein the regulatable clock is also connected to the computer in order to control the selection frequency so that this selection frequency is a multiple of the sampling frequency whereby said recorded values are selected in the memory with a selection frequency which is said multiple of the sampling frequency.

4. A system according to claim 2, wherein the means for applying multiplication factors comprise tables of stored multiplication factors for multiplication of stored values by one of these multiplication factors.

* * * * *